United States Patent [19]

Harris

[11] Patent Number: 4,544,902

[45] Date of Patent: Oct. 1, 1985

[54] MOUNT FOR MILLIMETER WAVE APPLICATION

[75] Inventor: David L. Harris, Beaverton, Oreg.

[73] Assignee: Tektronix, Inc., Beaverton, Oreg.

[21] Appl. No.: 564,818

[22] Filed: Dec. 21, 1983

[51] Int. Cl.$^4$ ............................................... H01P 1/00
[52] U.S. Cl. .................................... 333/250; 455/330; 333/206; 333/208
[58] Field of Search ....................... 333/103, 250, 258; 330/56, 287; 329/161; 455/325, 326, 328, 330

[56] References Cited

U.S. PATENT DOCUMENTS 4,063,186  12/1977  Rubin ................................ 333/250 X
4,255,730  3/1981  Sekine et al. ..................... 333/250 X Primary Examiner—Paul Gensler
Attorney, Agent, or Firm—John Smith-Hill; Francis I. Gray

[57] ABSTRACT

A signal modifying device comprises an elongate section of waveguide and a non-linear circuit element. A lateral through-hole is formed in a wall of the waveguide, and a rod-like conductive member is fitted in the hole and has one end presented towards the opposite wall region of the waveguide. The non-linear circuit element is secured to the rod-like member with one electrode connected in electrically conductive manner to the rod-like member and with a beam-like lead (which is connected to another electrode of the circuit element) extending towards the opposite wall region of the waveguide.

8 Claims, 4 Drawing Figures

MOUNT FOR MILLIMETER WAVE APPLICATION

This invention relates to a mounting technique for non-linear elements utilized in millimeter wave applications.

BACKGROUND OF THE INVENTION

The circuitry of a conventional spectrum analyzer is designed for optimum performance within a limited range of frequencies. For example, the Tektronix 492 Spectrum Analyzer, when used as a stand-alone instrument, is designed to analyze signals having frequency components in the range from 50 KHz to 21 GHz. However, it is frequently desired to analyze signals having components at frequencies higher than 21 GHz. This can be done using a conventional spectrum analyzer in conjunction with a mixer.

A mixer is a heterodyne conversion transducer which receives an input signal at a frequency $F_{in}$ and a mixing signal at a frequency $F_{lo}$ and produces an output signal having a series of frequency components at frequencies $F_i$ ($i = 1 \ldots n$) where $$F_i = F_{in} \mp iF_{lo} \qquad (1)$$

Thus, the tenth harmonic ($i=10$) of a mixing signal having a frequency of up to 6 GHz can be used to generate a mixed signal having a frequency of 10 GHz from an input signal component having a frequency of 70 GHz using the conversion $$F_{10} = F_{in} - 10F_{lo}$$

The mixed signal is fed to the spectrum analyzer and is analyzed in essentially the same way as an input signal provided directly to the analyzer and having a frequency of 10 GHz, the analyzer being calibrated in terms of the actual frequency of the input signal. Clearly, the conversions represented by subtractions of $iF_{lo}$ from $F_{in}$ are only permitted when the result of the subtraction yields a positive value of $F_i$.

Since the state of the transmission line art is such that signals at frequencies over about 40 GHz cannot be transmitted efficiently using coaxial cable, mixers for extending the frequency range of the Tektronix 492 Spectrum Analyzer are constructed using waveguide. The conventional waveguide mixer comprises a section of waveguide which is flanged for connection to a signal source and is connected to the analyzer by coaxial cable. The active element of the mixer is a probed diode disposed in the waveguide and having one electrode connected to the waveguide wall and its other electrode connected to the core conductor of the coaxial cable.

The probed diode used in conventional waveguide mixers is expensive to manufacture. The probed diode is a chip of semiconductor material of n-type conductivity having at one side a common cathode. A plurality of mutually isolated regions of p-type conductivity are formed on the chip at its other side, and each p-type region is associated with an individual gold anode. The chip is first positioned inside the waveguide section, secured at its cathode to the core of the coaxial cable connector, and is then probed using a metal catswhisker which is electrically connected to the wall of the waveguide to locate an anode associated with a pn junction having acceptable properties. This is a highly skilled and time-consuming operation requiring a delicate sense of touch. Once a satisfactory diode has been found, the catswhisker is clamped to the waveguide wall and the mixer undergoes various tests, several of which are directed towards ensuring that the catswhisker will maintain contact with the selected anode without puncturing the underlying diode. These tests are time consuming, and may reveal quite a high failure rate. Accordingly, the overall cost of using a probed diode is very high.

In addition, the conversion loss (ratio of the power of the signal under test to the power of the mixed signal) of a probed diode waveguide mixer is dependent on frequency to an undesirable extent.

The conversion loss of a waveguide mixer depends to a large extent on the electric field intensity in the region of the diode. The local field intensity can be increased by using a so-called ridged waveguide, i.e., a waveguide having a transverse ridge along a wide wall, and mounting the diode on the wide wall opposite the ridge.

It has been proposed that beam-lead diodes, which are less expensive than probed diodes, be used in waveguide applications, for example, in U.S. Pat. No. 4,246,556 issued Oct. 20, 1981. In the case of that proposal, the diode is packaged inside an annular body of dielectric material. This packaging has proved satisfactory for many purposes, but the annular dielectric body introduces a significant parasitic shunt capacitance which degrades performance at frequencies higher than 40 GHz.

It will be understood by those skilled in the art that electromagnetic radiation having a wavelength (in vacuum) of less than about 1 cm has a frequency of greater than about 30 GHz. A rectangular waveguide has its minimum impedance for a signal having a wavelength equal to twice the width (longer transverse dimension) of the guide, corresponding to a width of 0.5 cm or less for millimeter wave applications. However, a waveguide having a width of 0.5 cm is able to transmit without unreasonable loss a signal having a frequency as low as 18 GHz. The range from 18 GHz to 26 HGz is therefore considered to be the low end of the millimeter wave frequency range, notwithstanding the fact that the corresponding range of wavelengths (in vacuum) is from 1.66 cm to 1.15 cm. Accordingly, in this specification and in the appended claims the term "millimeter wave" is intended to be construed as relating to electromagnetic radiation having a frquency from about 18 GHz to about 220 GHz.

SUMMARY OF THE INVENTION

According to the present invention there is provided a signal modifying device which comprises an elongate section of waveguide and a non-linear circuit element. A lateral through-hole is formed in a wall of the waveguide, and a rod-like conductive member is fitted in the hole and has one end presented towards an opposite wall region of the waveguide. The non-linear circuit element is secured to the rod-like member with one electrode connected in electrically conductive manner to the rod-like member and with a beam-like lead (which is connected to another electrode of the circuit element) extending towards the opposite wall region of the waveguide.

The present invention is applicable to construction of a waveguide mixer, and in the preferred embodiment of the invention a second, plate-like conductive member is fitted in a recess in the opposite wall region of the waveguide so that one main face confronts the interior space of the waveguide. The plate is connected to the core conductor of a coaxial connector. The plate is insulated from the wall of the waveguide, which is connected to the shield conductor of the coaxial connector, and the rod-like member also is electrically connected to the wall of the waveguide. The non-linear element is a beam-lead diode having one lead secured in electrically conductive manner to the end of the rod-like member and its other lead contacting the plate in electrically conductive manner.

In the preferred embodiment of the invention, the beam-lead diode is supported by the rod and is not secured to the plate. In constructing the mixer, the rod is displaced through its hole in the waveguide wall to achieve contact between the lead (which is resiliently flexible) and the plate. This manner of construction does not require the high degree of skill and the delicate touch that are required when a probed diode is used, and the failure rate is greatly reduced.

BRIEF DESCRIPTION OF THE DRAWING

For a better understanding of the invention, and to show how the same may be carried into effect, reference will now be made, by way of example, to the accompanying drawings in which.

DETAILED DESCRIPTION

Figure 1:
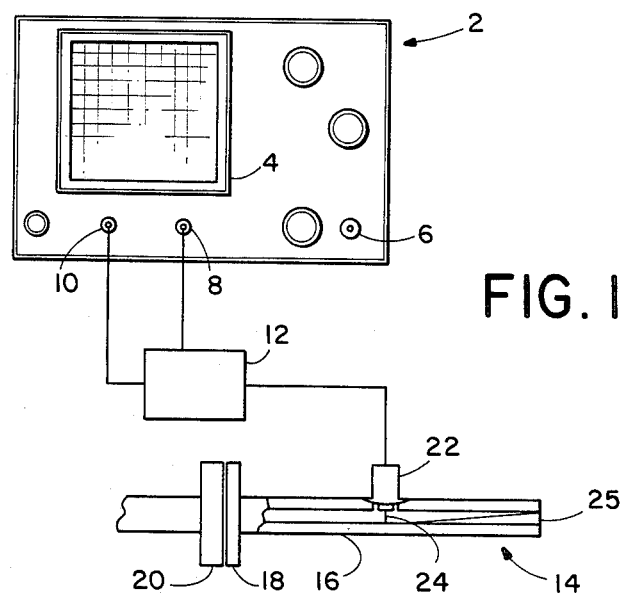
FIG. 1 represents in simplified form the manner in which a waveguide mixer embodying the invention is connected between a signal source and a spectrum analyzer.

FIG. 1 illustrates in simplified form a spectrum analyzer 2 of conventional construction, such as the Tektronix 492 Spectrum Analyzer. The analyzer 2 has a CRT display 4 for illustrating the distribution of power with reference to frequency in a signal under test. The analyzer has a coaxial input 6 for receiving signals from 50 kHz to 21 GHz, and also has an external mixer input 8 which is used when the signal under test has a frequency higher than 21 GHz (up to 220 GHz). Associated with the external mixer input 8 is a sweeping local oscillator output 10. The analyzer incorporates a YIG-tuned oscillator (not shown) which sweeps from 2 to 6 GHz, and the output signal from that oscillator is made available at the output 10. The input 8 and the output 10 are connected by coaxial cable to a diplexer 12 which is connected by coaxial cable to the waveguide mixer 14. The diplexer directs power received at low frequencies from the output 10 (including the range from 2 to 6 GHz) to the mixer 14, and directs power received at 2.072 GHz from the mixer 14 to the input 8. The mixer 14 comprises a length of rectangular waveguide 16 which is provided at one end with a flange 18 for connection to a corresponding flange 20 of a waveguide in which the signal under test is propagated. The waveguide section is provided intermediate its ends, in one of its wide walls 38 (FIG. 2) with a lateral coaxial connector 22, to which the coaxial cable from the diplexer 12 is connected. The two electrodes of a beam lead diode 24 are connected respectively to the core of the connector 22 and the opposite wide wall 36 (FIG. 2) of the waveguide section 16. Absorber 25 is provided in the interior space of the waveguide section 16 on the opposite side of the diode 24 from the flange 18, in order to prevent establishment of standing waves inside the waveguide section 16. The manner in which the waveguide mixer operates as a heterodyne transducer is described briefly above and is well understood by those skilled in the art. Accordingly, the principle of operation of the mixer will not be discussed in further detail.

The diode 24 is mounted inside the interior space of the waveguide using a rod 28. The beam lead diode comprises an unencapsulated body 30 of semiconductor material incorporating a pn junction, and two beam-like leads 32 and 34 are ohmically connected to the p and n-type regions respectively of the body 30. A suitable beam lead diode is that which is manufactured by Alpha Industries, Inc. and identified by part No. DMD 6939-99. The two leads of the beam lead diode are made of gold and are resiliently flexible.

Figure 2:
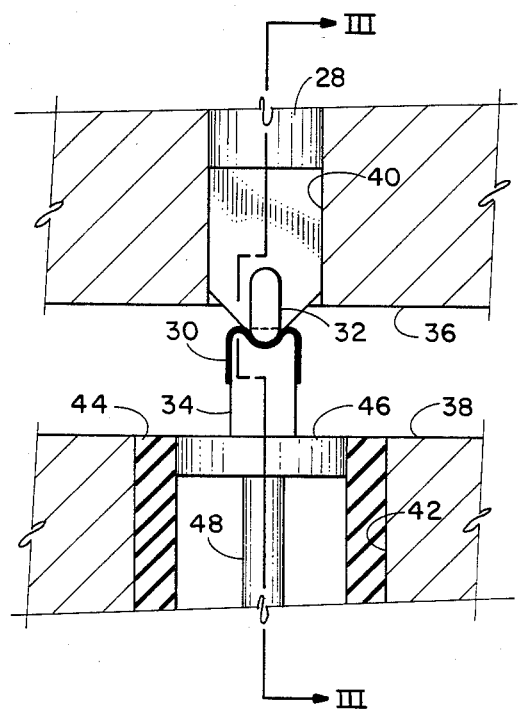
FIG. 2 is a fragmentary, longitudinal sectional view of a waveguide mixer embodying the present invention.
Figure 4:
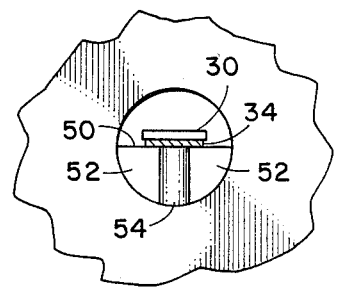
FIG. 4 is a view taken on the line IV—IV of FIG. 3.

As shown in FIG. 2, the wide walls 36 and 38 of the waveguide section are formed with respective bores 40 and 42. The bore 42 is lined in known manner with a sleeve 44 of dielectric material, and fitted within the sleeve 44 is a circular plate 46. The plate 46 is made of gold plated brass and is connected to a stem 48, also of gold plated brass. The stem 48 extends to the coaxial connector 22, whereby the stem 48 may be connected to the core conductor of a coaxial cable, the shield conductor of the cable being connected to the wall of the waveguide section 16. The plate 46 constitutes a low pass filter which prevents high frequency power from escaping from the waveguide by way of the coaxial connector. The bore 40 is narrower than the bore 42 and accommodates a metal rod 28 made of steel, nickel or brass wire. The wide wall 36 of the waveguide incorporates a clamp device, not shown, which, when released, permits the rod to be moved axially within the bore 40, and when engaged, holds the rod 28 fixed within the bore 40. The bores 40 and 42 are generally coaxially aligned. Thus, when the rod 28 is inserted through the bore 40, the leading end of the rod is presented towards the plate 46. At its leading end, the cylindrical rod is provided with a flat cut 50, so that the leading end portion of the rod is substantially semicircular in section, and the rod is chamfered at the two opposite ends of the diameter of the semicircular section, as shown at 52, so as to leave a narrow flat strip 54 approximately 0.25 mm wide at the leading end of the rod. It can be seen from FIG. 4, that the longitudinal dimension of the strip 54 is perpendicular to the plane of the flat 50.

Prior to inserting the rod 28 into the bore 40, the beam lead diode 24 is attached to the leading end of the rod. This may be accomplished using gold epoxy adhesive. For example, a drop of gold epoxy adhesive is placed on the flat surface 50 at the leading end of the rod, and the lead 32 of the diode is applied to the adhesive. Since the adhesive remains flowable until cured, but is nevertheless viscous and tacky, the diode can be placed in position accurately and will remain in position while the rod and the diode carried thereby are placed in an oven for curing the adhesive. When the adhesive is cured, the diode is secured firmly and in electrically conductive manner to the leading end of the rod. It will be appreciated that the polarity of the diode depends on the bias current provided to the diode by way of the coaxial connector 22.

When the rod and diode assembly has been formed, the rod is inserted into the bore 40 to place the diode in the interior cavity of the waveguide section. The lead 34 of the diode engages the plate 46, and this can readily be detected by an operator without need for a particularly delicate sense of touch. In any event, a small amount of excess pressure does not damage the diode but simply results in bending of the lead 34. When the rod is satisfactorily positioned in the bore 40, it is clamped in position using the previously-mentioned clamp and the end of the rod protruding to the exterior of the waveguide section is removed.

Figure 3:
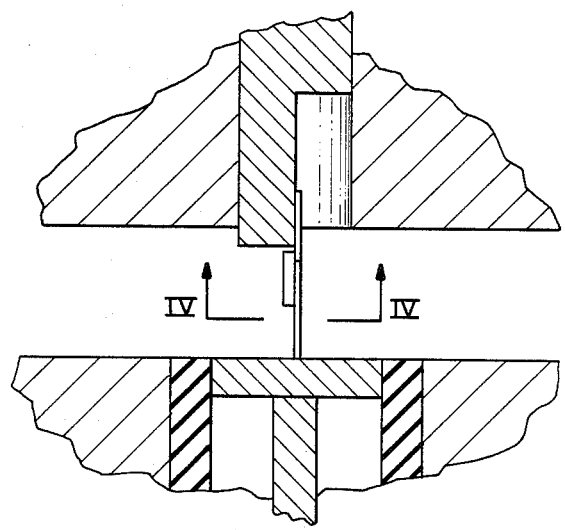
FIG. 3 is a part sectional view taken on the line III—III of FIG. 2.

It will be noted that the use of a beam lead diode in the waveguide mixer, in the manner described, avoids the above-mentioned disadvantages of use of a probed diode. Thus, the beam lead diode, having only a single pn junction, is less expensive to manufacture than a probed diode. The job of installing the beam lead diode in the waveguide is less time consuming, and requires a lower level of skill, than the operation of positioning the chip of the probed diode inside the waveguide and then probing the chip to locate an electrode associated with a junction having acceptable properties. One of the reasons why the catswhisker of the conventional waveguide mixer might not remain in contact with the selected electrode is that the catswhisker may slip off the electrode. It is clear from inspection of FIGS. 2 and 3 that there is virtually no possibility that the lead of the diode could slip off the plate 46. In addition, there is no danger that the operation of inserting the rod 28 into the bore 40 would result in the diode itself being damaged by contact with the plate 46, since the degree of pressure needed to distort the lead sufficiently for the semiconductor body to engage the plate 46 would be readily detected by all but the most insensitive operators. Incidentally, use of the beam lead diode with gold leads in combination with the gold plated brass plate 46 avoids degradation of the electrical contact between the lead and the plate owing to oxidation.

In the case of a rectangular waveguide that has a large height (the shorter transverse dimension) e.g., 2.39 mm, the waveguide may be ridged to concentrate the electric field in the region of the diode 24. In the case of a waveguide that has a small height, e.g. 0.65 mm, ridging is not required because the configuration of the leading end of the rod itself has the effect of concentrating the electric field in the region of the diode. The electric field is concentrated most efficiently when the rod is positioned with the longitudinal dimension of the strip 54 extending across the width of the guide, i.e., with the flat 50 lying in a plane defined by a first line that is parallel to the longitudinal axis of the guide and a second line that is perpendicular to the wide walls 36 and 38, and is most important at higher frequencies, e.g., higher than about 185 GHz.

It will be appreciated that the plate 46 and the flat strip 54 at the leading end of the rod 28 result in there being a capacitance connected in parallel with the diode, and that the value of this capacitance is adjustable by axial movement of the rod 28. In addition, the lead 34 itself constitutes an inductance in series with the diode. In addition, at high frequencies (greater than about 185 GHz) the internal inductance of the diode itself becomes significant. By movement of the rod 28 the circuit including the diode is tunable, so that the parallel capacitance neutralizes the inductance of the lead 34 and the diode 24, and this makes it possible to achieve a consistent and controllable conversion loss over a wide range of frequencies. It has been found that at high frequencies (greater than about 185 GHz), reduction of the parallel capacitance, e.g., by using a 45° conical taper at the leading end of the rod 28, the continued inductance of the diode 24 and the lead 34 is such that the conversion loss becomes unacceptable, even though at lower frequencies, e.g., 90 GHz, the conversion loss with a conical taper is tolerable. If the rod is not squared across its leading end, i.e., it is not conically tapered or chamfered as shown, the shunt capacitance is too large and therefore the conversion loss is not acceptable at frequencies above about 50 GHz.

It will be appreciated that the invention is not restricted to the particular waveguide mixer that has been shown and described, since variations may be made therein without departing from the scope of the invention as defined in the appended claims, and equivalents thereof. For example, it is not necessary that the leading end of the rod be configured and oriented precisely as shown for all frequencies. The invention is applicable generally to the mounting of a diode or other non-linear element in a waveguide, and not just to waveguide mixers. For example, if the connector 22 were not connected to a signal source (the local oscillator output 10), the diode would simply rectify the input signal and the device would function as a detector. A transistor could be mounted using a similar technique to provide an amplifier. In addition, the device would still function in the intended manner if the active element were secured to the plate 46 and its beam-like lead engaged, but was not secured to, the wall 36 of the waveguide.

I claim:

1. A signal modifying device comprising an elongate section of waveguide having conductive wall means defining an interior space and including a first wall portion of conductive material at one side of said interior space, and the device also comprising a second portion of conductive material in opposed relationship with said first portion across said interior space, and dielectric material electrically insulating said second portion of conductive material from said wall means, there being a lateral throughhole formed in one of said first and second portions of conductive material, and the signal modifying device further comprising a rod-like conductive member fitted in said hole formed in said one portion of conductive material and having one end presented towards the other of said first and second portions of conductive material, and a non-linear circuit element comprising a body of semiconductor material incorporating a pn junction, first and second electrodes connected to the body of semiconductor material at opposite respective sides of the junction, and a beam-like lead connected to said first electrode and extending from said body, said non-linear circuit element being secured to the rod-like member with said second electrode connected in electrically conductive manner to said rod-like member and said lead extending towards and in pressure contact with said other portion of conductive material.

2. A device according to claim 1, wherein the rod-like member is movable longitudinally within said through-hole.

3. A device according to claim 1, wherein said one portion of conductive material is constituted by a first wall of the section of waveguide and said section of waveguide has a second wall that is in opposed relationship, across said interior space, with respect to said first wall, and said other portion of conductive material is a plate-like member fitted in a recess in said second wall and said dielectric material electrically isolates said plate-like member from said second wall.

4. A device according to claim 3, further comprising a coaxial connector having a core conductor connected to said plate and a shield conductor connected to said second wall.

5. A signal modifying device comprising an elongate section of waveguide having conductive wall means defining an interior space and including a first wall portion of conductive material at one side of said interior space, and the device also comprising a second portion of conductive material in opposed relationship with said first portion across said interior space, and dielectric material electrically isolating said second portion of conductive material from said wall means, there being a lateral throughhole formed in one of said first and second portions of conductive material, and the signal modifying device further comprising a rod-like conductive member fitted in said hole formed in said one portion of conductive material and having one end presented towards the other of said first and second portions of conductive material, said rod being circular in cross-section except at said one end, being substantially semicircular in cross-section at said one end and being chamfered to present a strip-like end surface towards said other portion of conductive material, and a non-linear circuit element comprising a body of semiconductor material incorporating a pn junction, first and second electrodes connected to the body of semiconductor material at opposite respective sides of the junction, and a beam-like lead connected to said first electrode and extending from said body, said non-linear circuit element being secured to the rod-like member with said second electrode connected in electrically conductive manner to said rod-like member and said lead extending towards and in pressure contact with said other portion of conductive material.

6. A device according to claim 5, wherein the rod-like member is movable longitudinally within said through-hole.

7. A device according to claim 5, wherein said one portion of conductive material is constituted by a first wall of the section of waveguide, and said section of waveguide has a second wall that is in opposed relationship, across said interior space, with respect to said first wall, and said other portion of conductive material is a plate-like member fitted in a recess in said second wall and said dielectric material electrically isolates said plate-like member from said second wall.

8. A device according to claim 7, further comprising a coaxial connector having a core conductor connected to said plate and a shield conductor connected to said second wall.

* * * * *